(12) United States Patent
Lin et al.

(10) Patent No.: US 10,851,470 B2
(45) Date of Patent: Dec. 1, 2020

(54) SILICON CARBIDE CRYSTAL AND METHOD FOR MANUFACTURING THE SAME

(71) Applicant: GlobalWafers Co., Ltd., Hsinchu (TW)

(72) Inventors: Ching-Shan Lin, Hsinchu (TW); Jian-Hsin Lu, Hsinchu (TW); Chien-Cheng Liou, Hsinchu (TW); Man-Hsuan Lin, Hsinchu (TW)

(73) Assignee: GLOBALWAFERS CO., LTD., Hsinchu (TW)

( * ) Notice: Subject to any disclaimer, the term of this patent is extended or adjusted under 35 U.S.C. 154(b) by 0 days.

(21) Appl. No.: 15/941,129

(22) Filed: Mar. 30, 2018

(65) Prior Publication Data

US 2019/0106807 A1 Apr. 11, 2019

(30) Foreign Application Priority Data

Oct. 6, 2017 (TW) .............................. 106134548 A

(51) Int. Cl.
| | |
|---|---|
| *C30B 29/36* | (2006.01) |
| *C30B 23/02* | (2006.01) |
| *H01L 29/16* | (2006.01) |
| *H01L 29/36* | (2006.01) |
| *C30B 23/00* | (2006.01) |
| *H01L 29/32* | (2006.01) |
| *H01L 21/02* | (2006.01) |
| *C30B 25/02* | (2006.01) |

(52) U.S. Cl.
CPC .......... *C30B 23/025* (2013.01); *C30B 23/005* (2013.01); *C30B 25/02* (2013.01); *C30B 29/36* (2013.01); *H01L 21/0251* (2013.01); *H01L 21/02378* (2013.01); *H01L 21/02447* (2013.01); *H01L 21/02507* (2013.01); *H01L 21/02529* (2013.01); *H01L 21/02576* (2013.01); *H01L 21/02631* (2013.01); *H01L 29/1608* (2013.01); *H01L 29/32* (2013.01); *H01L 29/36* (2013.01)

(58) Field of Classification Search
CPC ...................................................... C30B 29/36
USPC ................................................. 438/763, 931
See application file for complete search history.

(56) References Cited

U.S. PATENT DOCUMENTS

| | | | |
|---|---|---|---|
| 7,563,321 B2 | 7/2009 | Powell et al. | |
| 2010/0031877 A1* | 2/2010 | Gupta | .................. C30B 23/002 |
| | | | 117/105 |

FOREIGN PATENT DOCUMENTS

| | | |
|---|---|---|
| CN | 101072901 A | 11/2007 |
| CN | 102714143 A | 10/2012 |
| CN | 105745364 A | 7/2016 |
| CN | 106256931 A | 12/2016 |
| TW | 200632154 A | 9/2006 |

* cited by examiner

*Primary Examiner* — Hsin Yi Hsieh
(74) *Attorney, Agent, or Firm* — Li & Cai Intellectual Property (USA) Office

(57) ABSTRACT

A silicon carbide crystal and a method for manufacturing the same are disclosed. The silicon carbide crystal includes a seed layer, a bulk layer, and a stress buffering structure formed between the seed layer and the bulk layer. The seed layer, the bulk layer, and the stress buffering structure are each formed with a dopant that cycles between high and low concentration. Therefore, the crystal defects can be significantly reduced.

2 Claims, 17 Drawing Sheets

US 10,851,470 B2

SILICON CARBIDE CRYSTAL AND METHOD FOR MANUFACTURING THE SAME

BACKGROUND OF THE INVENTION

1. Field of the Invention

The instant disclosure relates to an epitaxial crystal structure and a method for manufacturing the same, and more particularly to a silicon carbide crystal and a method for manufacturing the same.

2. Description of Related Art

Materials such as silicon (Si) and gallium arsenide (GaAs) are widely used in semiconductor devices. However, these material have a relatively small energy gap (i.e., 1.2 eV for Si and 1.42 eV for GaAs) and a relatively low breakdown voltage that are unfavorable for high power and high frequency application. Silicon carbide (SiC) is a material that has excellent physical and chemical properties such as wide energy gap, high thermal and electrical conductivity, high withstands voltage, and high saturation drift velocity of electrons, and is expected to be used in next-generation semiconductor devices.

SiC crystals do not exist in nature. The Physical Vapor Transport (PVT) is a main process for growing large-scale SiC single crystals. In this process, an SiC seed crystal is disposed in a low temperature region of a crystal growth crucible and an SiC raw material is disposed in a high temperature region. Then, the crystal growth crucible is filled with a noble gas and heated to between 1450° C. to 2400° C. Thus, the SiC raw material can be sublimated and epitaxially grown on the SiC seed crystal.

However, the growth speed of the SiC single crystal is slow and the growth mechanism of the SiC single crystal is very complex. In addition, the PVT process needs to create a temperature gradient in the growth of the SiC single crystal and thus causes difficulty in controlling process parameters such as heat field uniformity and gas phase composition. Once the process parameters are unstable, defects such as the micropipe defect and basal planar dislocation can easily form in the obtained single crystal structure. The micropipe defect especially limits the application of the SiC single crystal.

SUMMARY OF THE INVENTION

One aspect of the instant disclosure relates to a high quality silicon carbide crystal and a method for manufacturing the same.

One of the embodiments of the instant disclosure provides a silicon carbide crystal including a seed layer, a bulk layer, and a stress buffering structure formed between the seed layer and the bulk layer. The seed layer, the bulk layer, and the stress buffering structure are each formed with a dopant, and the dopant of the stress buffering structure cycles between high and low concentrations. The stress buffering structure includes a plurality of stacked buffer layers and a transition layer over the buffer layers, wherein the buffer layer closest to the seed layer has a variation trend of the dopant concentration similar to that of the buffer layer closest to the transition layer, and the transition layer has a dopant concentration approximately equal to that of the seed layer.

Another one of the embodiments of the instant disclosure provides a method for manufacturing a silicon carbide crystal, including the steps of forming a stress buffering structure on a seed layer and forming a bulk layer on the stress buffering structure. The seed layer, the bulk layer, and the stress buffering structure each are formed with a dopant, and the dopant of the stress buffering structure cycles between high and low concentrations. The stress buffering structure includes a plurality of stacked buffer layers and a transition layer over the buffer layers, wherein the buffer layer closest to the seed layer has a variation trend of the dopant concentration similar to that of the buffer layer closest to the transition layer, and the transition layer has a dopant concentration approximately equal to that of the seed layer.

One of the advantages of the instant disclosure is that the silicon carbide crystal in which the buffer layer closest to the seed layer has a variation trend of the dopant concentration similar to that of the buffer layer closest to the transition layer, and the transition layer has a dopant concentration approximately equal to that of the seed layer, thereby reducing the defect density and the residual stress level so as to increase the crystal quality.

To further understand the techniques, means and effects of the instant disclosure, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DETAILED DESCRIPTION OF THE PREFERRED EMBODIMENTS

The instant disclosure firstly discloses a novel method of growing a silicon carbide crystal and subsequently discloses the structural composition of the silicon carbide crystal. Compared to the conventional silicon carbide crystal grown by physical vapor transport (PVT), the instant method is capable of growing large-scale high-quality crystals having low defect density and low residual stress level.

Embodiments of a silicon carbide crystal and a method for manufacturing the same according to the instant disclosure are described herein. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

Notably, the terms first, second, third, etc., may be used herein to describe various elements or signals, but these elements or signals should not be affected by such elements or terms. Such terminology is used to distinguish one element from another or a signal with another signal. Further, the term "or" as used herein in the case may include any one or combinations of the associated listed items.

First Embodiment

Figure 1:
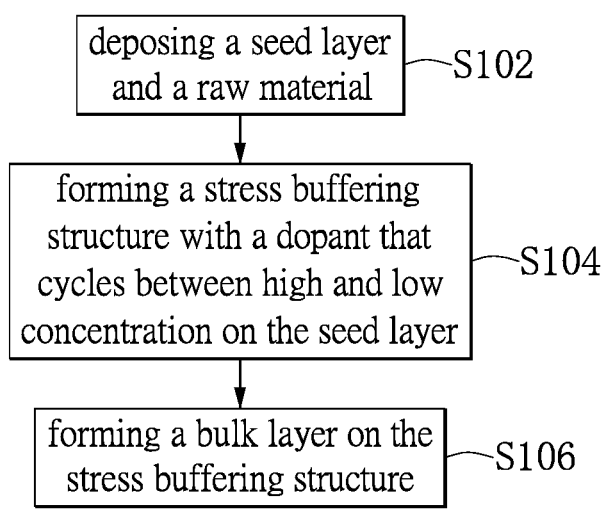
FIG. 1 is a flowchart of a method for manufacturing the silicon carbide crystal of the instant disclosure.

Referring to FIG. 1, the method S100 for manufacturing a silicon carbide (SiC) crystal according to this embodiment of the instant disclosure includes the following steps. Step S102 is deposing a seed layer and a raw material. Step S104 is forming a stress buffering structure with a dopant that cycles between high and low concentrations on the seed layer. Step S106 is forming a bulk layer on the stress buffering structure.

Figure 2:
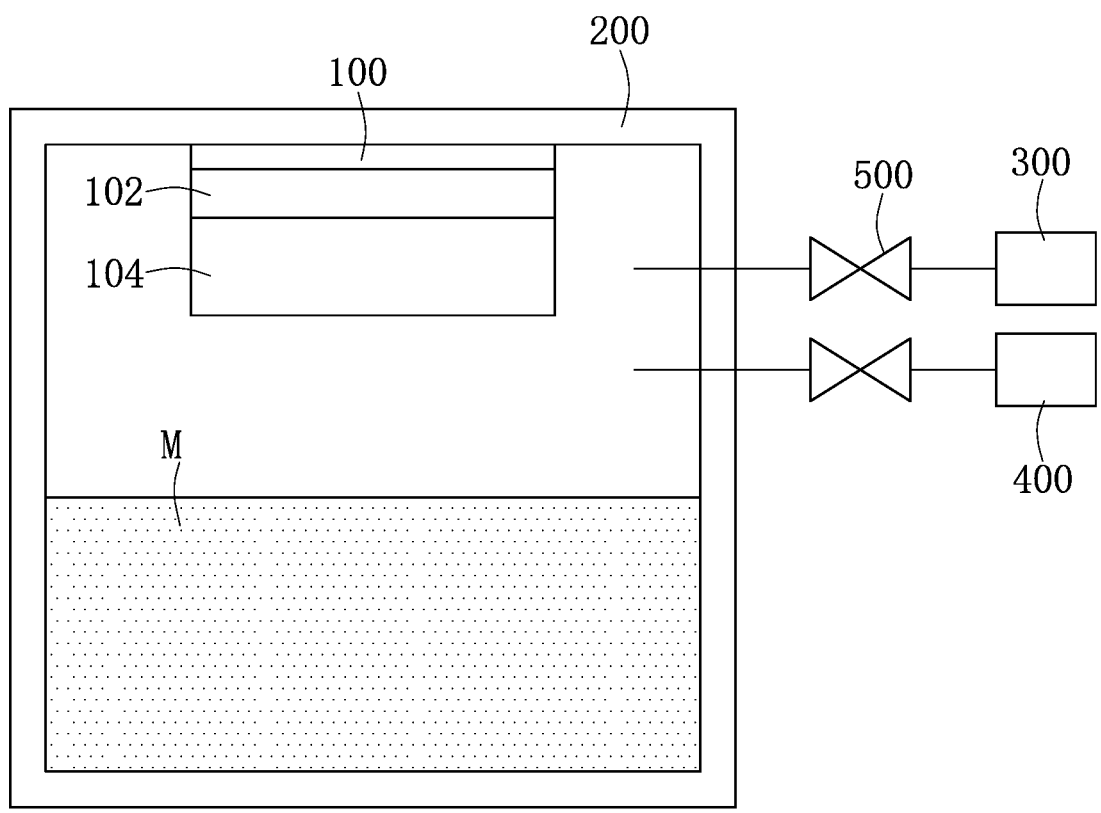
FIG. 2 is a perspective view showing a manufacturing process of the silicon carbide crystal.

Reference is next made to FIG. 2. In the step S102, the seed layer 100 and the raw material M can be deposed in a reactor 200. For example, the seed layer 100 is deposed at the top of the reactor 200 and the raw material M is deposed at the bottom of the reactor 200. The seed layer 100 is an SiC seed crystal and the raw material M is a solid material including elements of Si and C for crystal growth, such as an SiC powder and a mixture of pulverized Si particles and carbon powder. The reactor 200 can be a graphite crucible. The reactor 200 can be covered with a thermal insulation material and deposed in a vacuum chamber (not shown).

Figure 3A:
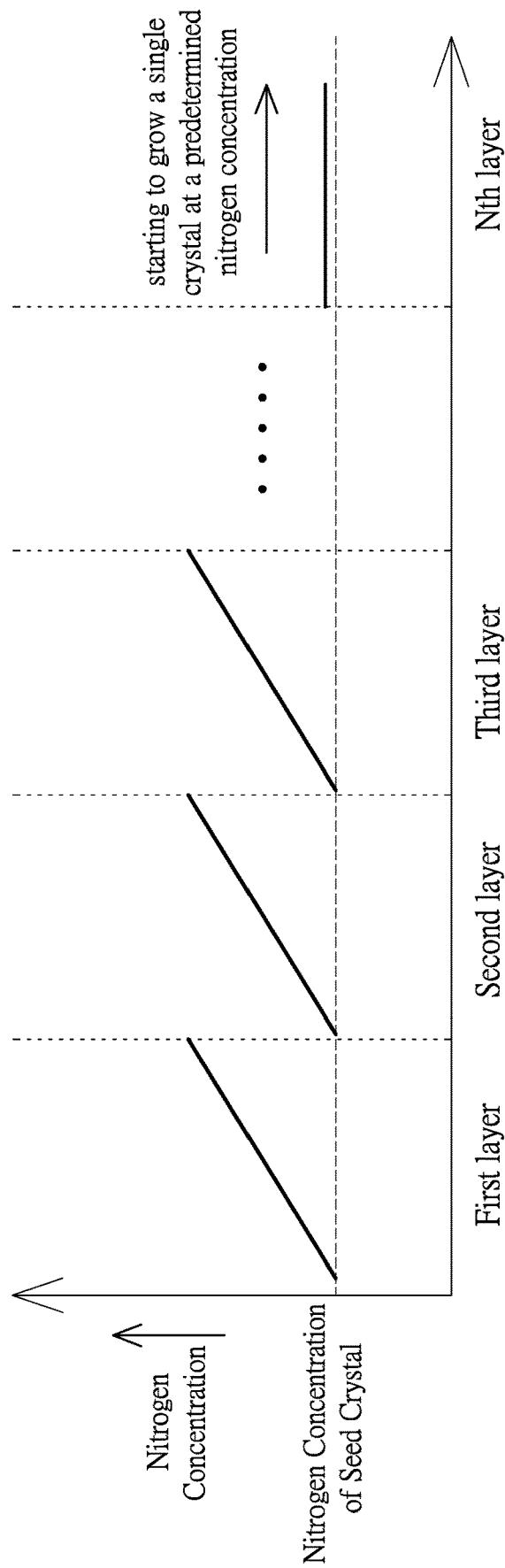
FIGS. 3A and 3B show the variation of alternate high and low level concentrations in dopant concentration in step S104 of the method according the first embodiment of the instant disclosure.
Figure 3B:
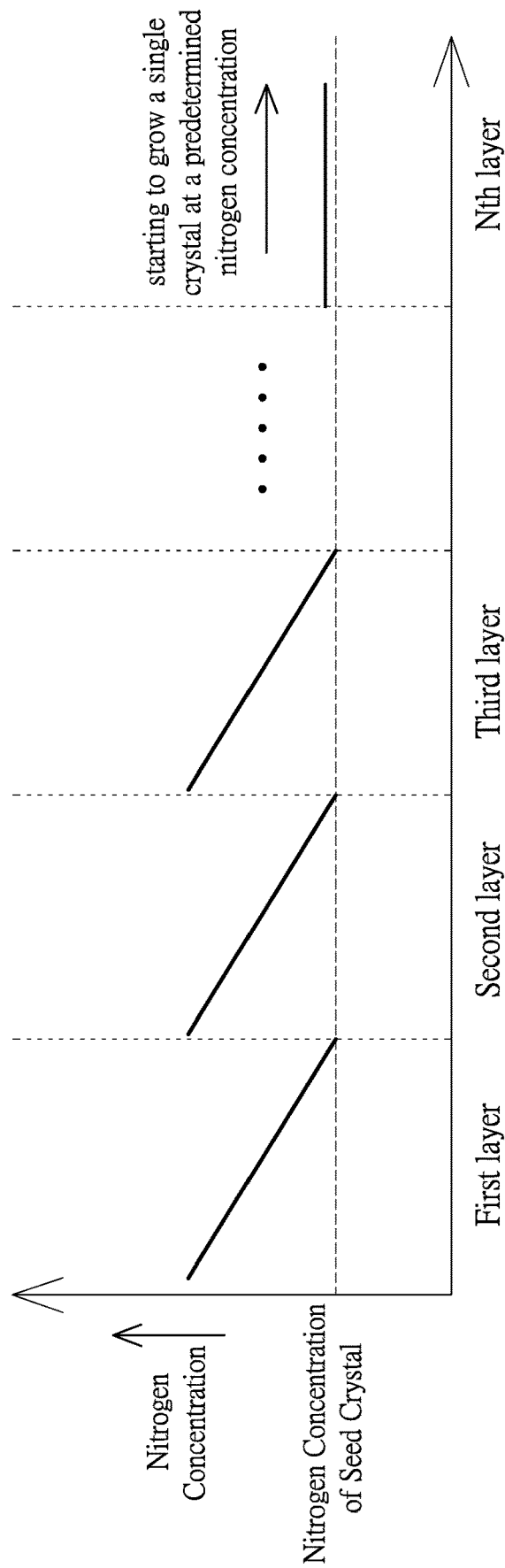

Referring to FIGS. 2, 3A and 3B, in the step S104, the formation within the reactor 200 is initiated at a pressure of about 300 Torr or greater and a temperature between about 1900° C. and about 2100° C. Thereafter, the dopant is fed in gas form into the reactor 200, and the concentration thereof is controlled to gradually increase or decrease between the dopant concentration of the seed layer 100 and a first concentration higher than or close to the dopant concentration of the seed layer 100. For the present embodiment, the dopant in the seed layer 100 has a reference concentration. The variation of alternate high and low level concentrations in dopant concentration of the stress buffering structure 102 means gradually increasing from the reference concentration to the first concentration within each of at least three successive predetermined time intervals, as shown in FIG. 3A, or gradually decreasing from the first concentration to the reference concentration within each of at least three successive predetermined time intervals, as shown in FIG. 3B. Preferably, any one of the buffer layers 1022 has a maximum dopant concentration not larger than ten times the reference concentration.

Although the dopant used in this embodiment is nitrogen as shown in FIGS. 3A and 3B, the dopant can be selected according to practical requirement. For example, the dopant can be boron (B), phosphorus (P), or aluminum (Al).

Figure 4:
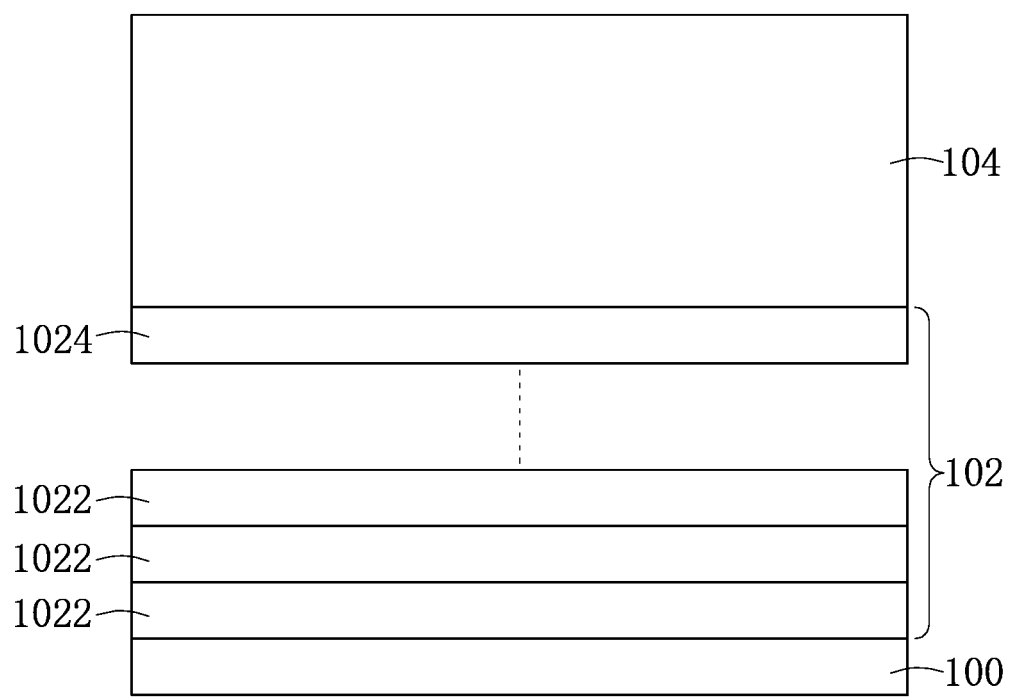
FIG. 4 is a cross-sectional perspective view of the silicon carbide crystal of the instant disclosure.

Reference is made to FIGS. 3A, 3B and 4. The stress buffering structure 102 can have at least three continuous gradations in dopant concentration according to particular implementation, wherein a buffer layer 1022 can be formed after the completion of each continuous gradation in dopant concentration. More specifically, the stress buffering structure 102 includes a plurality of buffer layers 1022 (e.g., at least three buffer layers). Each buffer layer 1022 has a thickness greater than 0 μm and less than 0.1 μm and a dopant concentration gradient in its thickness direction. The dopant concentration gradient gradually increases or decreases between the first concentration and the reference concentration. Once the desired numbers of the buffer layers 1022 have been formed, a further transition layer 1024 having a dopant concentration approximately equal to that of the seed layer 100 is formed over the buffer layers 1022. Thereafter, the formation of the stress buffering structure 102 is completed.

It should be noted that, the stress buffering structure 102 has a thickness of less than 0.1 mm and includes a plurality of stacked buffer layers 1022 and a transition layer 1024 over the buffer layers 1022. The buffer layer 1022 closest to the seed layer 100 has a variation trend of the dopant concentration similar to that of the buffer layer 1022 closest to the transition layer 104. The transition layer 1024 has a dopant concentration approximately equal to that of the seed layer 100.

In the present embodiment, the dopant is exemplified as nitrogen atoms, and the nitrogen gas can be provided by a nitrogen gas source 300 and its flow rate can be controlled by a mass flow controller (MFC) 400. The MFC 400 enables a precise control of the flow rate of nitrogen gas such that the dopant concentration variation as mentioned above can be achieved. The minimum flow rate of nitrogen gas can reach about 0.01 sccm (standard cubic cm per minute) and the maximum flow rate of nitrogen gas can reach about 30,000 sccm. Preferably, the nitrogen concentration of the seed layer 100 ranges from about $1 \times 10^{15}/cm^3$ to about $1 \times 10^{19}/cm^3$. The maximum nitrogen concentration of the stress buffering structure 102 is not higher than ten times the nitrogen concentration of the seed layer 100.

Furthermore, the pressure in the reactor 200 can be maintained at a predetermined pressure in the presence of a noble gas. The noble gas such as argon (Ar) can be supplied from an argon gas source 500 connected to the reactor 200. The pressure in the reactor 200 can be quickly heated to a predetermined temperature by an induction coil (not shown).

Referring to FIGS. 2 and 4, in the step S106, the process conditions in the reactor are changed in relation to the growth of the bulk layer 104. More specifically, the pressure in the reactor 200 is reduced to lower than 100 Torr, the temperature in the reactor 200 is increased to about 2100° C. to about 2200° C., and the supplied flow rate of nitrogen gas is unchanged. The dopant concentration of the bulk layer 104 is equal to or close to that of the seed layer 100. The bulk layer 104 is formed of the same crystal material as the seed layer 100, such as 3C-SiC, 4H-SiC, and 6H-SiC. The bulk layer 104 can be used to manufacture semiconductor elements or new seed crystals.

It should be noted that the method S100 for manufacturing a silicon carbide crystal of the instant disclosure forms a stress buffering structure 102 on the seed layer 100 with a dopant that cycles between high and low concentrations before the growth of the seed layer 104 (i.e., the initial stage of the crystal growth). Therefore, the interface defects between the seed and bulk layers and the crystal defects can be reduced, the residual stress in the crystal can be reduced, and the crystal growth time can be shortened.

Second Embodiment

Figure 5A:
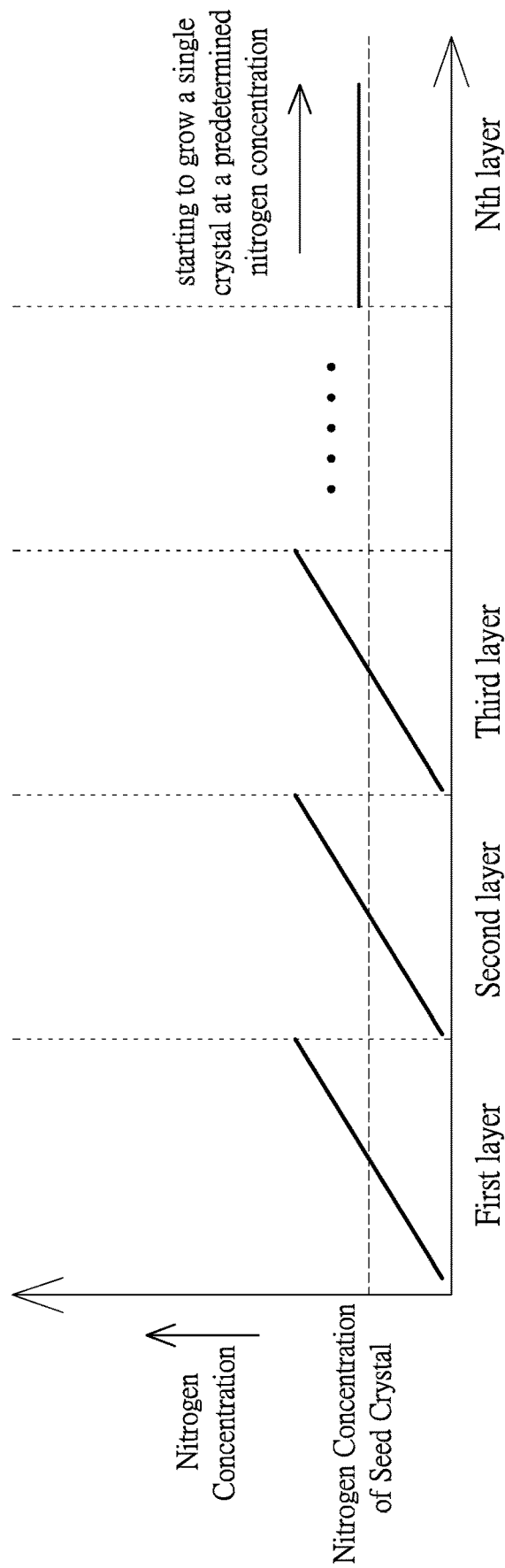
FIGS. 5A and 5B show the variation of alternate high and low level concentrations in dopant concentration in step S104 of the method according the second embodiment of the instant disclosure.
Figure 5B:
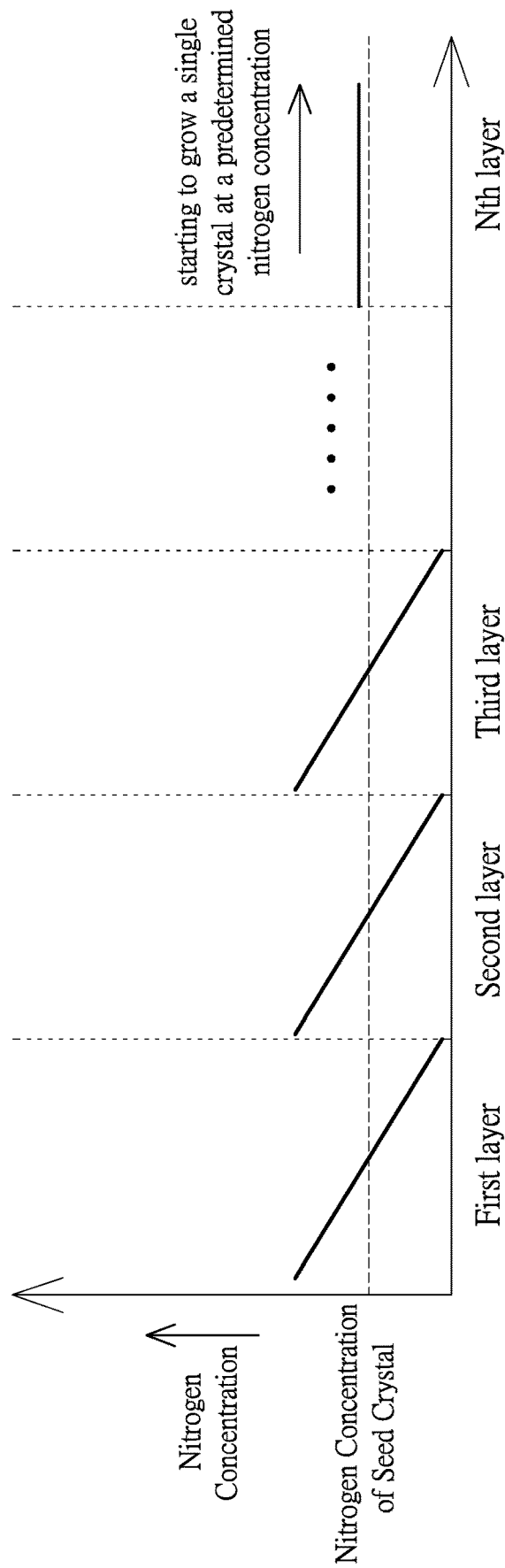

Reference is made to FIGS. 5A and 5B, which show another example of the variation of alternate high and low level concentrations in dopant concentration in the step S104. The main difference between the first and second embodiments is that the dopant concentration of the stress buffering structure 102 is controlled to gradually increase or decrease between a first concentration higher than the dopant concentration of the seed layer 100 and a second concentration lower than the dopant concentration of the seed layer 100. In other words, the dopant in the seed layer 100 has a reference concentration. The variation of alternate high and low level concentrations in dopant concentration of the stress buffering structure 102 according to this embodiment means gradually increasing from the second concentration to the first concentration within each of at least three successive predetermined time intervals, as shown in FIG. 5A, or gradually decreasing from the first concentration to the second concentration within each of at least three successive predetermined time intervals, as shown in FIG. 5B.

Referring to FIG. 4, the grown stress buffering structure 102 according to this embodiment includes a plurality of stacked buffer layers 1022 (i.e., at least three stacked buffer layers) and a transition layer 1024 over the buffer layers 1022. Each buffer layer 1022 has a dopant concentration gradient in its thickness direction, and the dopant concentration gradient gradually increases or decreases between the first concentration and the second concentration. Each buffer layer 1022 has a thickness greater than 0 μm and less than 0.1 μm. The stress buffering structure 102 has a thickness of less than 0.1 mm.

Third Embodiment

Figure 6A:
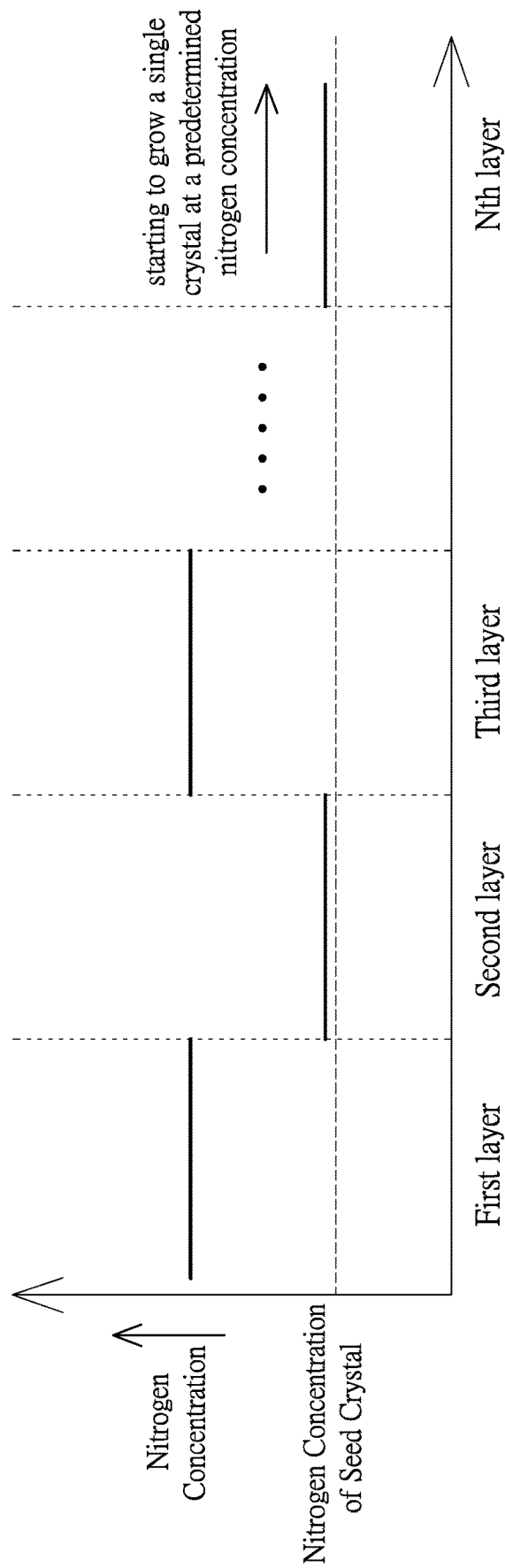
FIGS. 6A and 6B show the variation of alternate high and low level concentrations in dopant concentration in step S104 of the method according the third embodiment of the instant disclosure.
Figure 6B:
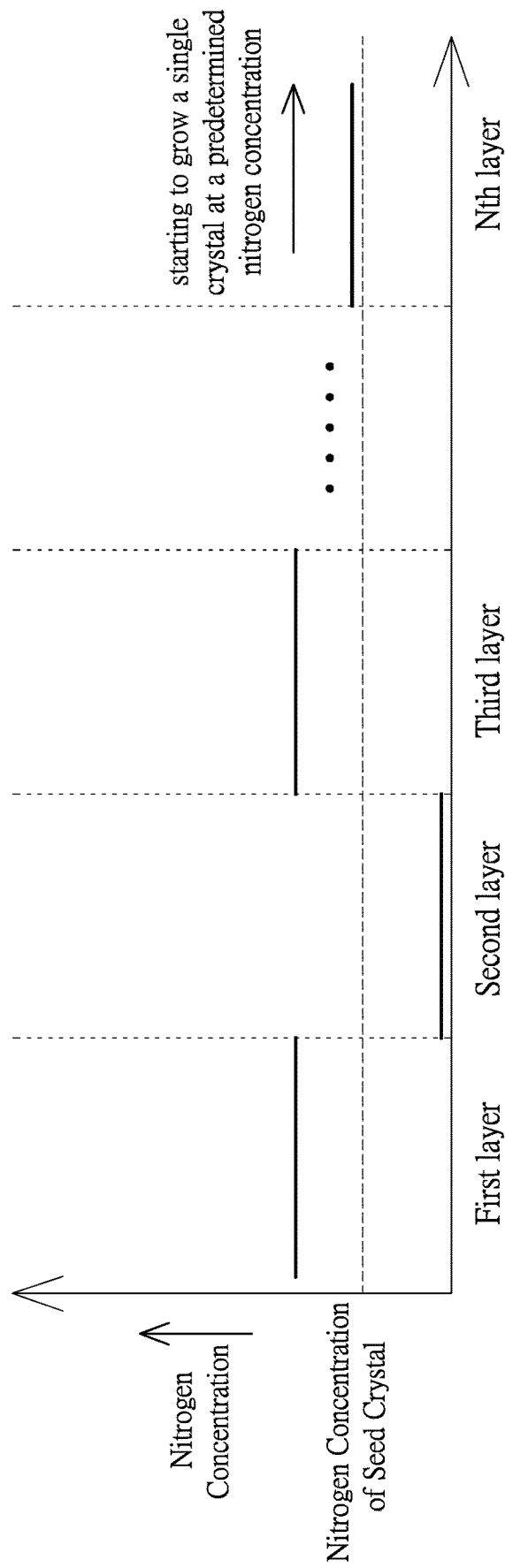

Reference is made to FIGS. 6A and 6B, which show another example of the variation of alternate high and low level concentrations in dopant concentration in the step S104. The main difference between the third and above-mentioned embodiments is that the dopant concentration of the stress buffering structure 102 is controlled to alternately vary between the dopant concentration of the seed layer 100 and a first concentration higher than the dopant concentration of the seed layer 100, or alternately vary between a first concentration higher than the dopant concentration of the seed layer 100 and a second concentration lower than the dopant concentration of the seed layer 100. In other words, the dopant in the seed layer 100 has a reference concentration. The variation of alternate high and low level concentrations in dopant concentration of the stress buffering structure 102 according to this embodiment means alternately varying from the first concentration within one of at least three successive predetermined time intervals to the second concentration within a later one of the at least three successive predetermined time intervals.

Figure 7:
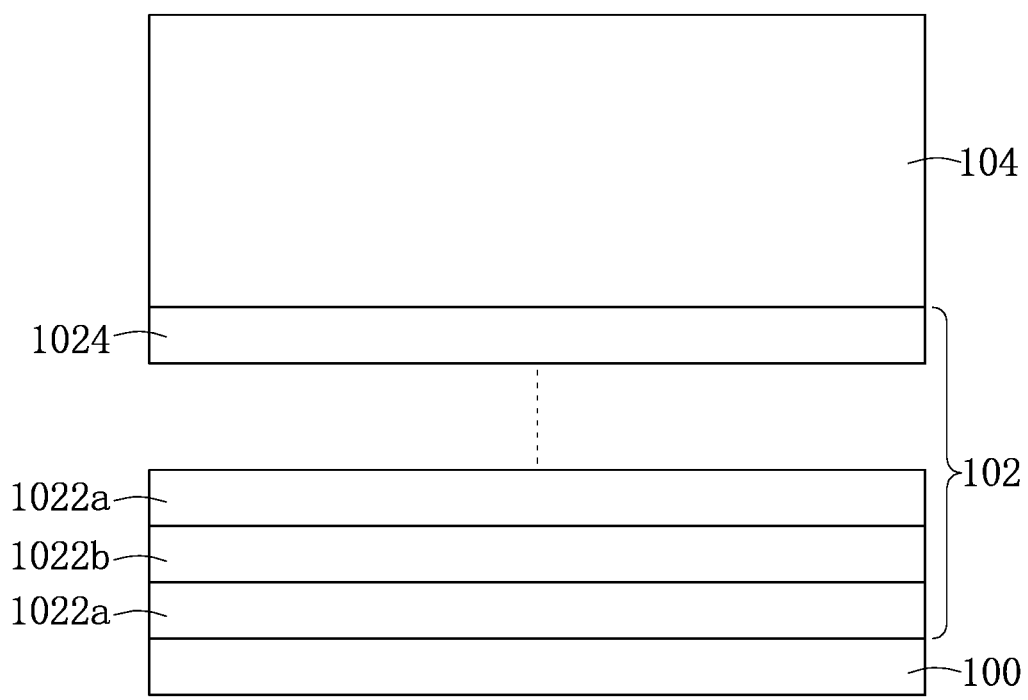
FIG. 7 is another cross-sectional perspective view of the silicon carbide crystal of the instant disclosure.

Referring to FIG. 7, the grown stress buffering structure 102 according to this embodiment includes at least one first buffer layer 1022a, at least one second buffer layer 1022b alternately stacked with the at least one first buffer layer 1022a, and a transition layer 1024 over the first and second buffer layers 1022a, 1022b. The numbers of the first and second buffer layers 1022a, 1022b are not less than three, respectively. The dopant in each first buffer layer 1022a has a constant concentration higher than the reference concentration, and the dopant in each second buffer layer 1022b has a constant concentration lower than or equal to the reference concentration. The first and second buffer layers 1022a, 1022b each have a thickness greater than 0 μm and less than 0.1 μm. The stress buffering structure 102 has a thickness of less than 0.1 mm.

Fourth Embodiment

Figure 8:
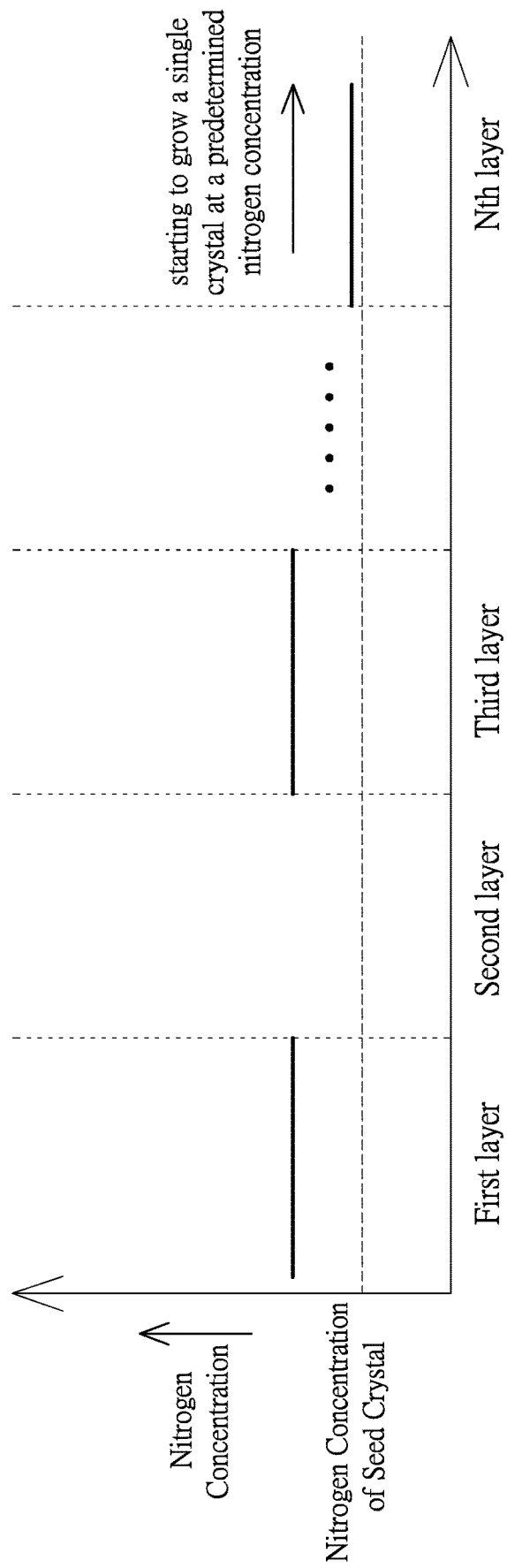
FIG. 8 shows the variation of alternate high and low level concentrations in dopant concentration in step S104 of the method according the fourth embodiment of the instant disclosure.

Reference is made to FIG. 8, which shows still another example of the variation of alternate high and low level concentrations in dopant concentration in the step S104. The main difference between the fourth and the previous embodiments is that the dopant in the stress buffering structure 102 is intermittently doped at a first concentration higher than or equal to the dopant concentration of the seed layer 100. In this embodiment, the term "intermittently implemented" is used to mean that the dopant is doped after every predetermined time interval.

Referring to FIG. 7, the grown stress buffering structure 102 according to this embodiment includes at least one first buffer layer 1022a, at least one second buffer layer 1022b alternately stacked with the at least one first buffer layer 1022a, and a transition layer 1024 over the first and second buffer layers 1022a, 1022b. The dopant in each first buffer layer 1022a has a constant concentration higher than or equal to the reference concentration, and the dopant in each second buffer layer 1022b has an approximately zero concentration. The first and second buffer layers 1022a, 1022b each have a thickness greater than 0 μm and less than 0.1 μm. The stress buffering structure 102 has a thickness of less than 0.1 mm.

Fifth Embodiment

Figure 9:
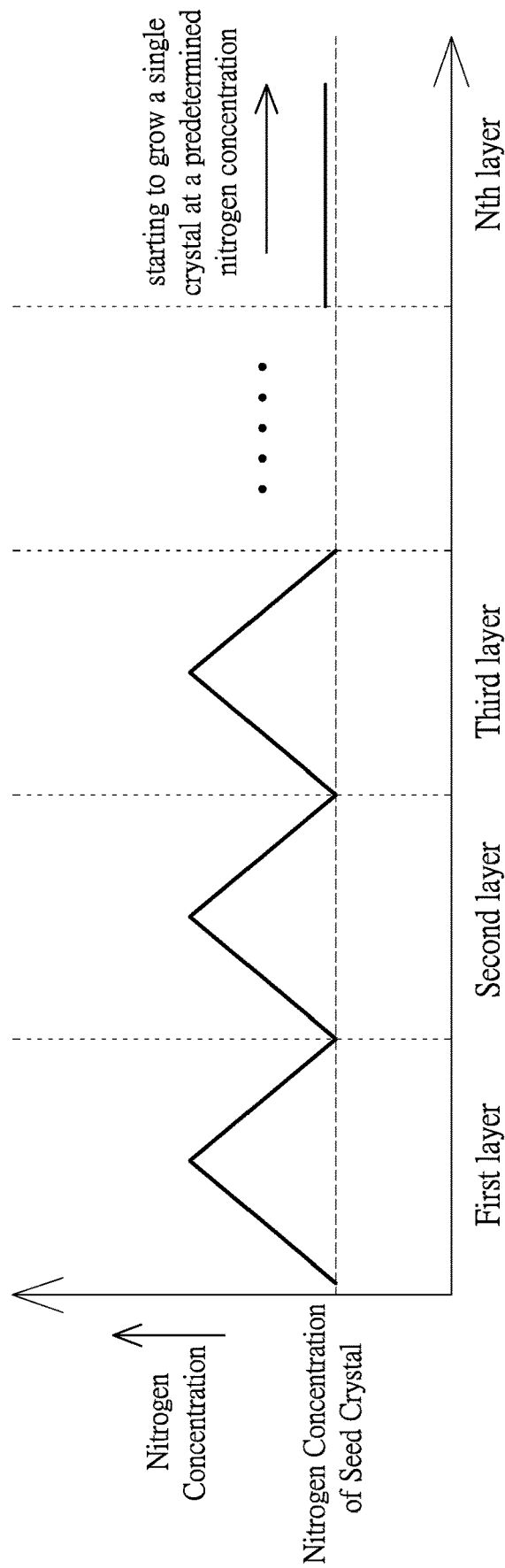
FIGS. 9, 10A and 10B show the variation of alternate high and low level concentrations in dopant concentration in step S104 of the method according the fifth embodiment of the instant disclosure.
Figure 10A:
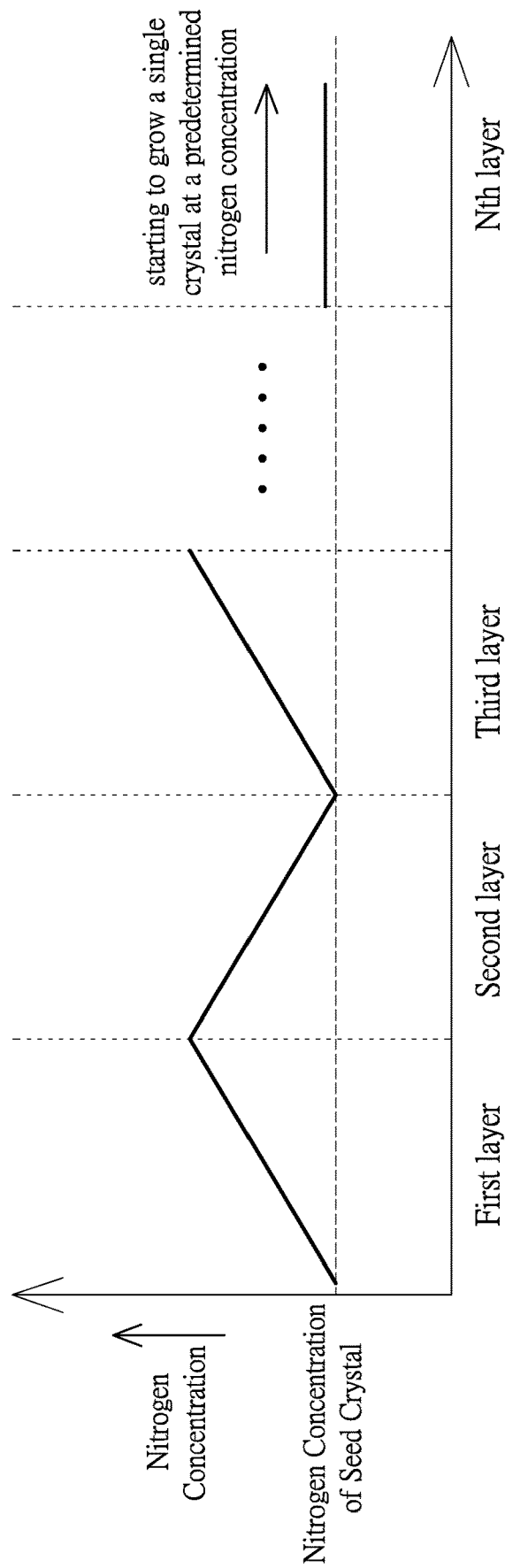
Figure 10B:
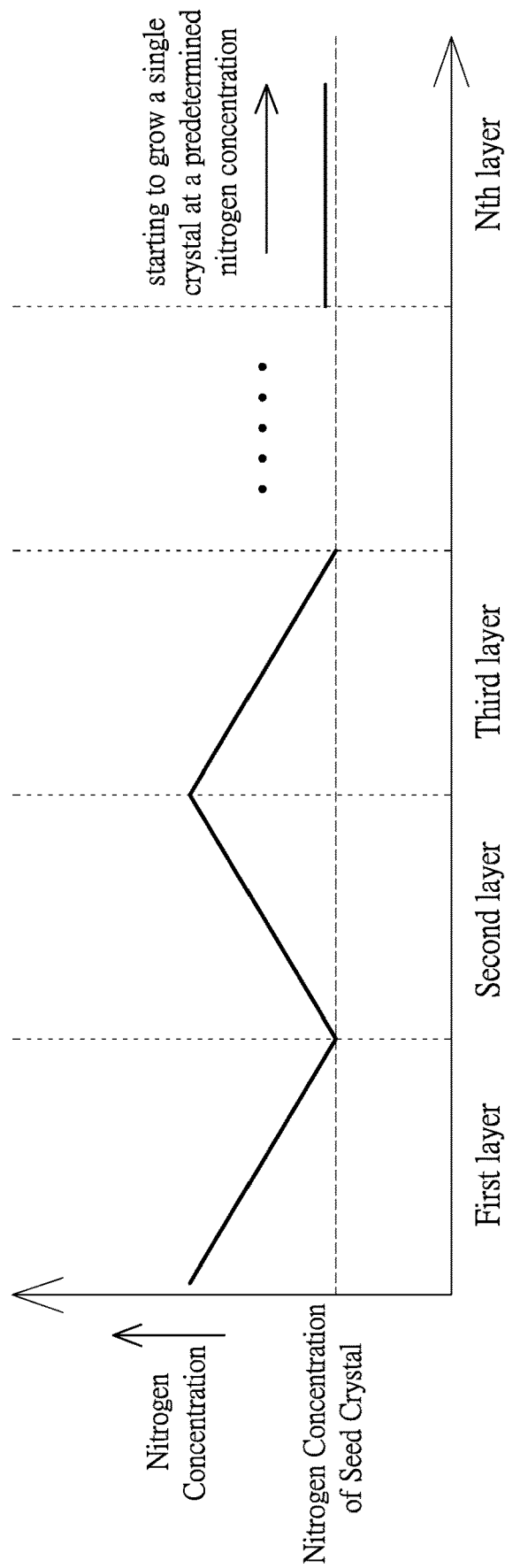

Reference is made to FIGS. 9, 10A and 10B, which show yet another example of the variation of alternate high and low level concentrations in dopant concentration in the step S104. The main difference between the fifth and the previous embodiments is that the dopant concentration of the stress buffering structure 102 is controlled to gradually increase or decrease between the dopant concentration of the seed layer 100 and a predetermined peak concentration. In other words, the dopant in the seed layer 100 has a reference concentration. The variation of alternate high and low level concentrations in dopant concentration of the stress buffering structure 102 according to this embodiment means gradually increasing from the reference concentration to the predetermined peak concentration and then gradually decreasing from the predetermined peak concentration to the reference concentration within each of at least three successive predetermined time intervals, or gradually decreasing from the predetermined peak concentration to the reference concentration and then gradually increasing from the reference concentration to the predetermined peak concentration within each of at least three successive predetermined time intervals.

It should be noted that the difference between the variation of alternate high and low level concentrations in dopant concentration as shown in FIG. 9 and FIGS. 10A and 10B is that the increase and decrease of the dopant concentration are more moderate. As shown in FIG. 9, a variation of alternate high and low level concentrations in dopant concentration occurs in each buffer layer 1022. As shown in FIGS. 10A and 10B, a variation of alternate high and low level concentrations in dopant concentration occurs between the two adjacent buffer layers 1022.

Referring to FIG. 4, the grown stress buffering structure 102 according to this embodiment can include a plurality of stacked buffer layers 1022 (e.g., at least three buffer layers) and a transition layer 1024 over the buffer layers 1022. Each buffer layer 1022 has a dopant concentration gradient in its thickness direction, and the dopant concentration gradient gradually increases from the reference concentration to the predetermined peak concentration and then gradually decreases from the predetermined peak concentration to the reference concentration. Each buffer layer 1022 has a thickness greater than 0 µm and less than 0.1 µm. The stress buffering structure 102 has a thickness of less than 0.1 mm.

Referring to FIG. 7, the grown stress buffering structure 102 according to this embodiment can include at least one first buffer layer 1022a, at least one second buffer layer 1022b alternately stacked with the at least one first buffer layer 1022a, and a transition layer 1024 over the first and second buffer layers 1022a, 1022b. Each first buffer layer 1022a has a first dopant concentration gradient in its thickness direction and each second buffer layer 1022b has a second dopant concentration gradient different from the first dopant concentration gradient in its thickness direction. The first and second buffer layers 1022a, 1022b each have a thickness greater than 0 µm and less than 0.1 µm. The stress buffering structure 102 has a thickness of less than 0.1 mm. More specifically, if the first dopant concentration gradient gradually increases from the reference concentration to the predetermined peak concentration, the second dopant concentration gradient would gradually decrease from the predetermined peak concentration to the reference concentration. In contrast, if the first dopant concentration gradient gradually decreases from the predetermined peak concentration to the reference concentration, the second dopant concentration gradient gradually increases from the reference concentration to the predetermined peak concentration.

Sixth Embodiment

Figure 11:
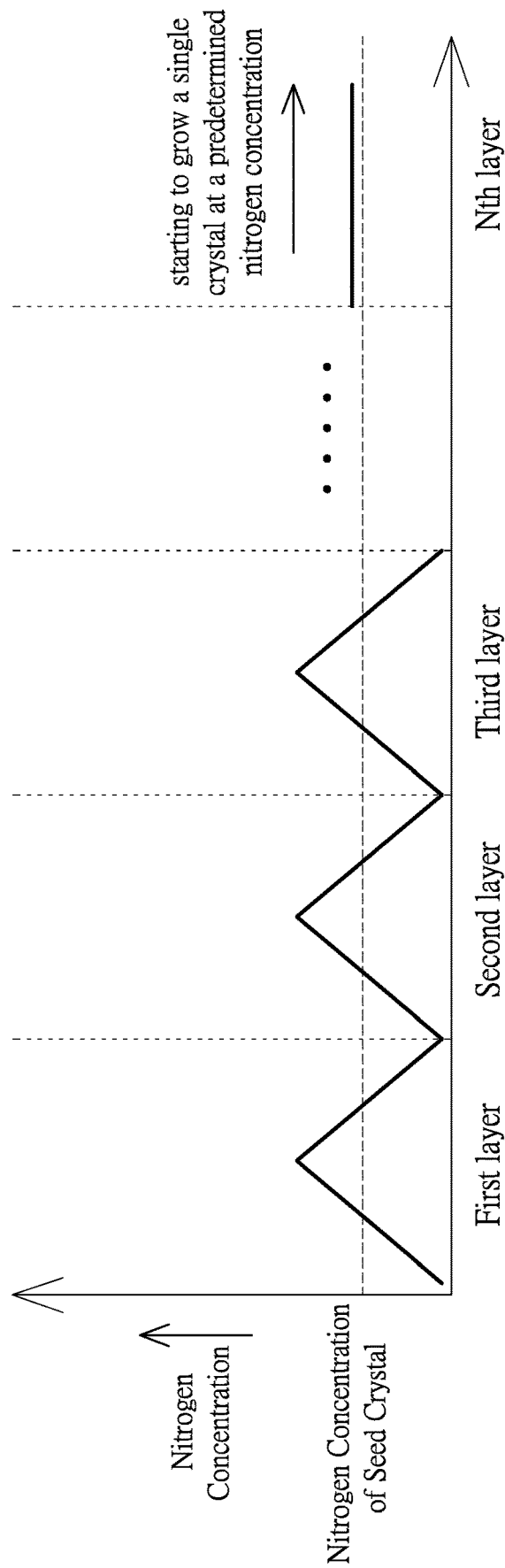
FIGS. 11, 12A and 12B show a further example of the variation of alternate high and low level concentrations in dopant concentration in step S104 of the method according the sixth embodiment of the instant disclosure.
Figure 12A:
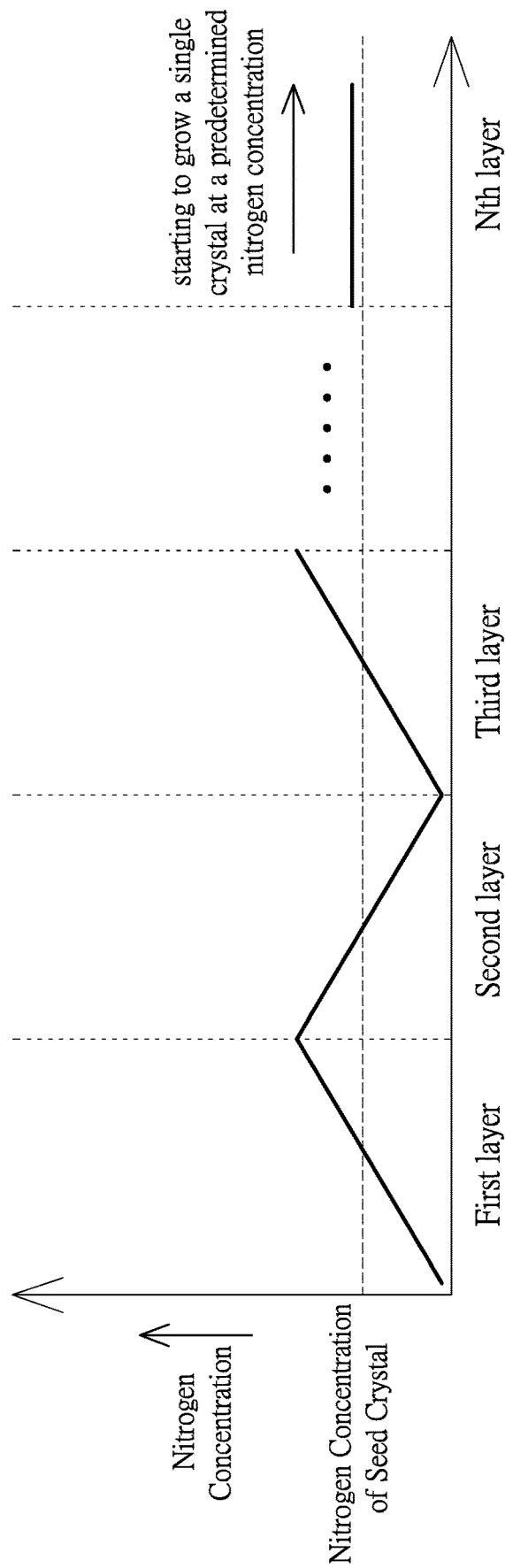
Figure 12B:
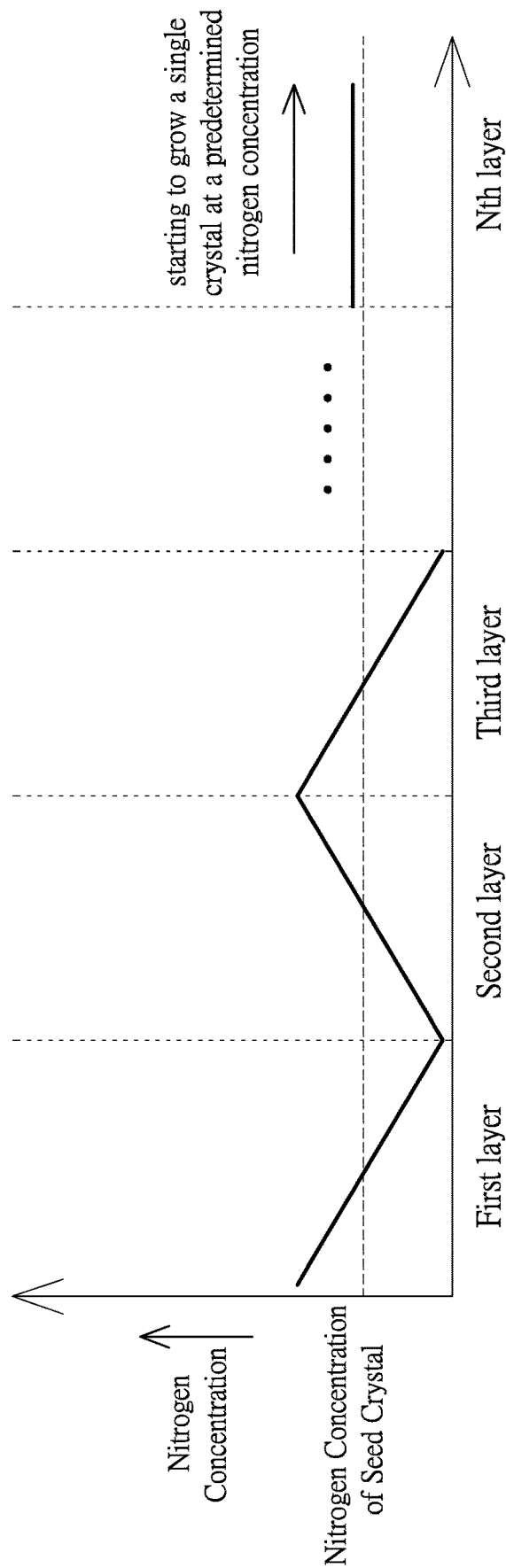

Reference is made to FIGS. 11, 12A and 12B, which show a further example of the variation of alternate high and low level concentrations in dopant concentration in the step S104. The main difference between the sixth and the previous embodiments is that the dopant concentration of the stress buffering structure 102 is controlled to gradually increase or decrease between a second concentration lower than the dopant concentration of the seed layer 100 and a predetermined peak concentration. In other words, the variation of alternate high and low level concentrations in dopant concentration of the stress buffering structure 102 according to this embodiment means gradually increasing from the second concentration to the predetermined peak concentration and then gradually decreasing from the predetermined peak concentration to the second concentration within each of at least three successive predetermined time intervals, or gradually decreasing from the predetermined peak concentration to the second concentration and then gradually increasing from the second concentration to the predetermined peak concentration within each of at least three successive predetermined time intervals.

Please note that the difference between the variation of alternate high and low level concentrations in dopant concentration as shown in FIG. 11 and FIGS. 12A and 12B is that the increase and decrease of the dopant concentration are more moderate. As shown in FIG. 11, a variation of alternate high and low level concentrations in dopant concentration occurs in each buffer layer 1022. As shown in FIGS. 12A and 12B, a variation of alternate high and low level concentrations in dopant concentration occurs between the two adjacent buffer layers 1022.

Referring to FIG. 4, the grown stress buffering structure 102 according to this embodiment can include a plurality of stacked buffer layers 1022 (e.g., at least three buffer layers) and a transition layer 1024 over the buffer layers 1022. Each buffer layer 1022 has a dopant concentration gradient in its thickness direction, and the dopant concentration gradient gradually increases from the second concentration to the predetermined peak concentration and then gradually decreases from the predetermined peak concentration to the second concentration. Each buffer layer 1022 has a thickness greater than 0 µm and less than 0.1 µm. The stress buffering structure 102 has a thickness of less than 0.1 mm.

Please refer to FIG. 7. The grown stress buffering structure 102 according to this embodiment can include at least one first buffer layer 1022a, at least one second buffer layer 1022b alternately stacked with the at least one first buffer layer 1022a, and a transition layer 1024 over the first and second buffer layers 1022a, 1022b. Each first buffer layer 1022a has a first dopant concentration gradient in its thickness direction and each second buffer layer 1022b has a second dopant concentration gradient different from the first dopant concentration gradient in its thickness direction. The first and second buffer layers 1022a, 1022b each have a thickness greater than 0µm and less than 0.1 µm. The stress buffering structure 102 has a thickness of less than 0.1 mm. More specifically, if the first dopant concentration gradient gradually increases from the second concentration to the predetermined peak concentration, the second dopant concentration gradient would gradually decrease from the predetermined peak concentration to the second concentration. In contrast, if the first dopant concentration gradient gradually decreases from the predetermined peak concentration to the second concentration, the second dopant concentration gradient would gradually increase from the second concentration to the predetermined peak concentration.

Table 1 below illustrates the comparison of main crystal defects in the SiC crystal directly grown ons the seed layer and the SiC crystal grown on the seed layer by the stress buffering structure under the same growth conditions (e.g., temperature and pressure). In Table 1, the comparative example represents the SiC crystal directly grown on the seed layer, and examples 1-6 respectively represent the SiC crystals grown on the stress buffering structures having different trends of the dopant concentration according to the first to sixth embodiments.

TABLE 1

|  | micropipe defect density (1/cm²) | basal plane dislocation density (1/cm²) |
|---|---|---|
| comparative example | 3 | 3,500 |
| example 1 | 0.01 | 500 |
| example 2 | 0.05 | 750 |
| examples 3 and 4 | 0.03 | 600 |
| example 5 | 0.1 | 800 |
| example 6 | 0.2 | 900 |

As shown in Table 1, compared to the SiC crystal directly grown on the seed layer, the SiC crystal grown on the seed layer by the stress buffering structure has significantly reduced micropipe defect and basal plane dislocation densities. Therefore, the instant method is capable of growing large-scale and high-quality crystals.

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. A method for manufacturing a silicon carbide crystal, comprising steps of forming a stress buffering structure of the silicon carbide crystal on a seed layer of the silicon carbide crystal, and then forming a buffer layer of the silicon carbide crystal on the stress buffering structure, wherein the seed layer, the bulk layer, and the stress buffering structure are each formed with a dopant, and the dopant of the stress buffering structure cycles between high and low dopant concentrations;

characterized in that the stress buffering structure includes at least three stacked buffer layers and a transition layer over the buffer layers, wherein the buffer layer closest to the seed layer has the same variation trend of the dopant concentration as the buffer layer closest to the transition layer, and the dopant concentration of the transition layer is equal to the dopant concentration of the seed layer;

wherein the stress buffering structure has a thickness less than 0.1 mm, and each of the buffer layers has a thickness less than 0.1 µm;

wherein each of the buffer layers has a dopant concentration gradient in a thickness direction thereof, the dopant of the seed layer has a reference concentration, and the dopant concentration gradient gradually increases from the reference concentration to a peak concentration and then gradually decreases from the peak concentration to the reference concentration.

2. The method of claim 1, wherein the stress buffering structure is formed under a pressure of 300 Torr or higher.

* * * * *